United States Patent
Conti et al.

(10) Patent No.: US 7,263,617 B2
(45) Date of Patent: Aug. 28, 2007

(54) METHOD AND SYSTEM FOR DETECTING A SECURITY VIOLATION USING AN ERROR CORRECTION CODE

(75) Inventors: Gregory Remy Philippe Conti, Saint Paul (FR); Jerome Laurent Azema Le Cellini, Villeneuve-Loubet (FR)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 11/619,283

(22) Filed: Jan. 3, 2007

(65) Prior Publication Data

US 2007/0124653 A1    May 31, 2007

Related U.S. Application Data

(62) Division of application No. 11/081,431, filed on Mar. 16, 2005.

(30) Foreign Application Priority Data

Oct. 11, 2004    (EP)    ................................. 04292405

(51) Int. Cl.
*H04L 9/32*    (2006.01)
*G06F 11/30*   (2006.01)
*G06F 12/14*   (2006.01)

(52) U.S. Cl. ..................... 713/188; 726/24; 714/52; 714/782

(58) Field of Classification Search ............... 714/52, 714/782; 713/188; 726/24
See application file for complete search history.

(56) References Cited

U.S. PATENT DOCUMENTS 6,353,890 B1 *    3/2002    Newman ................. 713/193
7,003,715 B1 *    2/2006    Thurston ................ 714/782

* cited by examiner

*Primary Examiner*—Guy J. Lamarre
(74) *Attorney, Agent, or Firm*—Steven A. Shaw; W. James Brady; Frederick J. Telecky, Jr.

(57) ABSTRACT

A system and method for detecting a security violation using an error correction code. Some illustrative embodiments may be a method used in a computing system comprising reading a codeword comprising data and an error correction code (ECC) (the ECC associated with the data), deriving an error location polynomial (ELP) from the codeword, determining a total number of codeword errors from the ELP, and preventing access to the data within the codeword if the total number of codeword errors exceeds a maximum number of correctable errors.

25 Claims, 3 Drawing Sheets

US 7,263,617 B2

METHOD AND SYSTEM FOR DETECTING A SECURITY VIOLATION USING AN ERROR CORRECTION CODE

CROSS REFERENCE TO RELATED APPLICATIONS

This application is a Divisional of and claims priority under 35 USC § 121 to U.S. patent application Ser. No. 11/081,431; filed Mar. 16, 2005; entitled Method and System for Detecting a Security Violation Using an Error Correction Code. This application claims priority under 35 USC § 119 to European Application Number 04292405.0 filed on Oct. 11 2004.

BACKGROUND

1. Technical Field

The present subject matter relates to detecting and counteracting attempts to reprogram semiconductor devices that store secure information. More particularly, the subject matter relates to using an error correction code programmed into the semiconductor device to detect attempts at altering the original programmed values.

2. Background

Manufacturers have become increasingly aware of the need to make mobile communication devices secure. In recent years there has been a significant increase in attempts by unscrupulous individuals to intercept communications from such devices in order to capture identification information unique to each mobile communication device. Once captured, this information may then be used to re-program a similar mobile communication device. The use of such a "cloned" mobile communication device (e.g., a cellular telephone) may result in charges being assessed against the owner of the original device for services utilized by the operator of the cloned device.

Manufacturers of mobile communication devices have attempted to address the problem by utilizing electrically programmable fuses, also known as "e-fuses," to program security related information (e.g., encryption keys and device identification numbers) into semiconductor devices. The use of e-fuses was intended to prevent later re-programming of security related information. But advances in technology and increases in the sophistication of the unscrupulous individuals engaging in the cloning of mobile electronic devices has resulted in the development of techniques for reprogramming e-fuses, something that was previously thought to be either impossible or beyond the abilities of those individuals engaging in such cloning activities.

Accordingly, a system capable of detecting that an e-fuse based or other similar device has been re-programmed, and which is also capable of either restoring the original programmed value or of preventing operation of the reprogrammed device is desirable.

SUMMARY OF SOME OF THE EMBODIMENTS

The problems noted above are addressed in large part by a system and method for detecting a security violation using an error correction code. Some illustrative embodiments may be a method used in a computing system comprising reading a codeword comprising data and an error correction code (ECC) (the ECC associated with the data), deriving an error location polynomial (ELP) from the codeword, determining a total number of codeword errors from the ELP, and preventing access to the data within the codeword if the total number of codeword errors exceeds a maximum number of correctable errors.

Other illustrative embodiments may be a computing system comprising a security controller, a non-volatile memory that stores a codeword comprising data and an ECC (the ECC associated with the data), an ECC decoder that reads the codeword from the non-volatile memory and calculates an ELP from the codeword (the ECC decoder coupled to the non-volatile memory), and an integrity analyzer that derives a number of codeword errors from the ELP, the integrity analyzer coupled to the ECC decoder and the security controller. A maximum number of correctable errors is defined for the computing system. The integrity analyzer signals a security violation to the security controller if the number of codeword errors exceeds the maximum number of correctable errors.

Yet further illustrative embodiments may be a mobile communication device comprising a radio frequency (RF) transceiver having one or more modes of operation, a non-volatile memory that stores a codeword comprising data and an ECC (the ECC associated with the data), a maximum number of codeword errors stored in the non-volatile memory, and a data security system that reads the codeword from the non-volatile memory, the data security system coupled to the non-volatile memory and to the RF transceiver. The data security system determines a number of codeword errors. The data security system disables a mode of operation of the one or more modes of operation of the RF transceiver if the number of codeword errors exceeds the maximum number of correctable errors.

Yet further illustrative embodiments may be a method used in a mobile communication device comprising reading a codeword comprising data and an ECC (the ECC associated with the data), deriving an ELP from the codeword, determining a total number of codeword errors from the ELP, and preventing use of a feature of the mobile communication device if the total number of codeword errors exceeds a maximum number of correctable errors.

BRIEF DESCRIPTION OF THE DRAWINGS

For a detailed description of the preferred embodiments of the invention, reference will now be made to the accompanying drawings in which.

NOTATION AND NOMENCLATURE

Certain terms are used throughout the following discussion and claims to refer to particular system components. This document does not intend to distinguish between components that differ in name but not function.

In the following discussion and in the claims, the terms "including" and "comprising" are used in an open-ended fashion, and thus should be interpreted to mean "including but not limited to . . . ." Also, the term "couple" or "couples" is intended to mean either an indirect or direct electrical connection. Thus, if a first device couples to a second device, that connection may be through a direct electrical connection, or through an indirect electrical connection via other devices and connections. Additionally, the term "system" refers to a collection of two or more parts and may be used to refer to a computer system or a portion of a computer system.

DETAILED DESCRIPTION OF THE EMBODIMENTS

Figure 1:
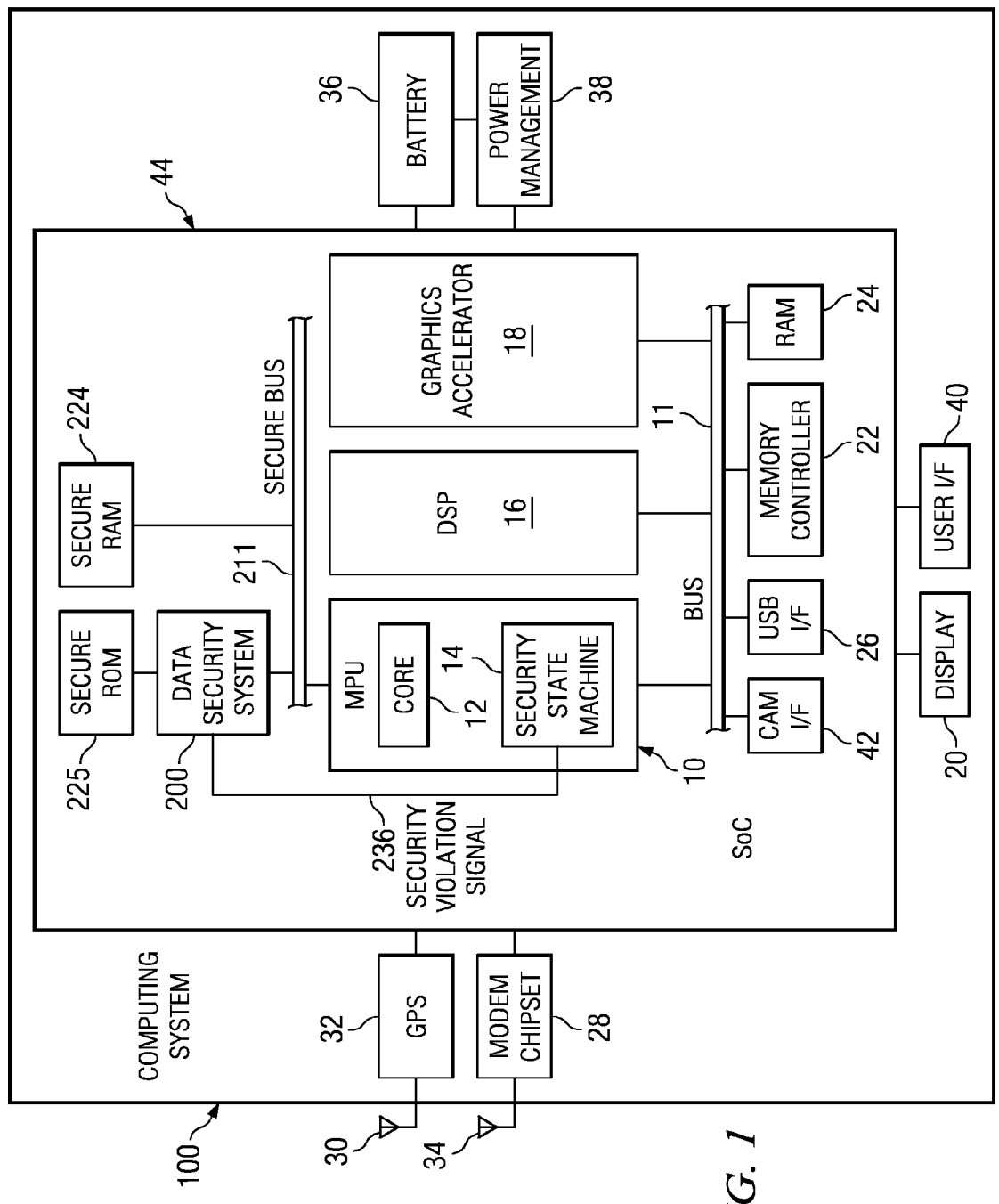
FIG. 1 illustrates a computing system constructed in accordance with at least some embodiments of the invention.

FIG. 1 shows a computing system 100 constructed in accordance with at least some embodiments of the invention. The computing system 100 may comprise a multiprocessing unit (MPU) 10 coupled to various other system components by way of a data and instruction bus (Bus) 11. The MPU 10 may comprise a processor core (Core) 12 that executes applications, possibly by having a plurality of processing pipelines. The MPU 10 may further comprise a security state machine (SSM) 14, which aids in allowing the computing system 100 to enter a secure mode for execution of secure software, and which further monitors operation during the secure mode to ensure secure operation.

The computing system 100 may further comprise a digital signal processor (DSP) 16 that aids the MPU 10 by performing task-specific computations, such as graphics manipulation and speech processing. A graphics accelerator 18 may couple both to the MPU 10 and DSP 16 by way of the Bus 11. The graphics accelerator 18 may perform necessary computations and translations of information to allow display of information, such as on display device 20. The computing system 100 may further comprise a memory controller (MEM CNTL) 22 coupled to random access memory (RAM) 24 by way of the Bus 11. The memory controller 22 may control access to and from the RAM 24 by any of the other system components such as the MPU 10, the DSP 16 and the graphics accelerator 18.

The computing system 100 may also comprise secure random access memory (Secure RAM) 224 and secure read-only memory (Secure ROM) 225. The secure RAM 224 may couple to MPU 10 by way of the secure data and instruction bus (Secure Bus) 211. The secure ROM may couple to the ROM security system 200, which in turn may couple to the MPU 10 by way of the secure bus 211. The MPU 10 may access the secure memories while operating in a secure mode. The RAM 24 and secure RAM 224 may be any suitable random access memory, such as synchronous RAM or RAMBUS™-type RAM. The secure ROM 225 may be any suitable read-only memory that uses some form of a program one time, read many times technology, such as an electrical fuse or "E-fuse" ROM (e.g., Texas Instruments JBP28S42 Bi-Polar PROM).

The computing system 100 may further comprise a USB interface (USB I/F) 26 coupled to the various system components by way of the Bus 11. The USB interface 26 may allow the computing system 100 to couple to and communicate with external devices.

The security state machine 14, preferably a hardware-based state machine, monitors system parameters and allows the secure mode of operation to initiate such that secure programs may execute from and access a portion of the RAM 24, the secure RAM 224, and/or the secure ROM 225. Having this secure mode is valuable for any type of computer system, such as a laptop computer, a desktop computer, or a server in a bank of servers. However, in accordance with at least some embodiments of the invention, the computing system 100 may be a mobile computing system, e.g., a cellular telephone, personal digital assistant (PDA), text messaging system, and/or a computing device that combines the functionality of a messaging system, personal digital assistant and a cellular telephone. Thus, some embodiments may comprise a modem chipset 28 coupled to an external antenna 34 and/or a global positioning system (GPS) circuit 32 likewise coupled to an external antenna 30.

Because the computing system 100 in accordance with at least some embodiments is a mobile device, computing system 100 may also comprise a battery 36 providing power to the various processing elements, possibly controlled by a power management unit 38. A user may input data and/or messages into the computing system 100 by way of the user interface (User I/F) 40, such as a keyboard, keypad, or touch panel. Because many cellular telephones also comprise the capability of taking digital still and video pictures, in some embodiments the computing system 100 may comprise a camera interface (CAM I/F) 42 which may enable camera functionality, possibly by coupling the computing system 100 to a charge-coupled device (CCD) array (not shown) for capturing digital images.

In accordance with at least some embodiments of the invention, many of the components illustrated in FIG. 1, while possibly available as individual integrated circuits, are preferably integrated or constructed onto a single semiconductor die 44. Thus, the MPU 10, digital signal processor 16, memory controller 22 and RAM 24, along with some or all of the remaining components, are preferably integrated onto a single semiconductor die, and thus may be integrated into a computing device 100 as a single packaged component. Having multiple devices integrated onto the single semiconductor die 44, especially devices comprising a MPU 10 and RAM 24, may be referred to as a system-on-a-chip (SoC) or a megacell.

The security state machine 14 may also monitor signals from other components of the computing system 100 that may detect security violations necessitating action by the security state machine 14. The data security system 200 illustrated in FIG. 1 may provide such an input to the security state machine 14. This input may be in the form of a security violation signal 236 that indicates to the security state machine 14 that the data security system 200 has detected an alteration of the data stored in the secure ROM 225. The alteration may have been caused by a malicious user attempting to reprogram the secure ROM 225 using, for example, a stolen identification number from another computing system such as a cellular telephone. Such reprogramming is sometimes referred to as "cloning."

Figure 2:
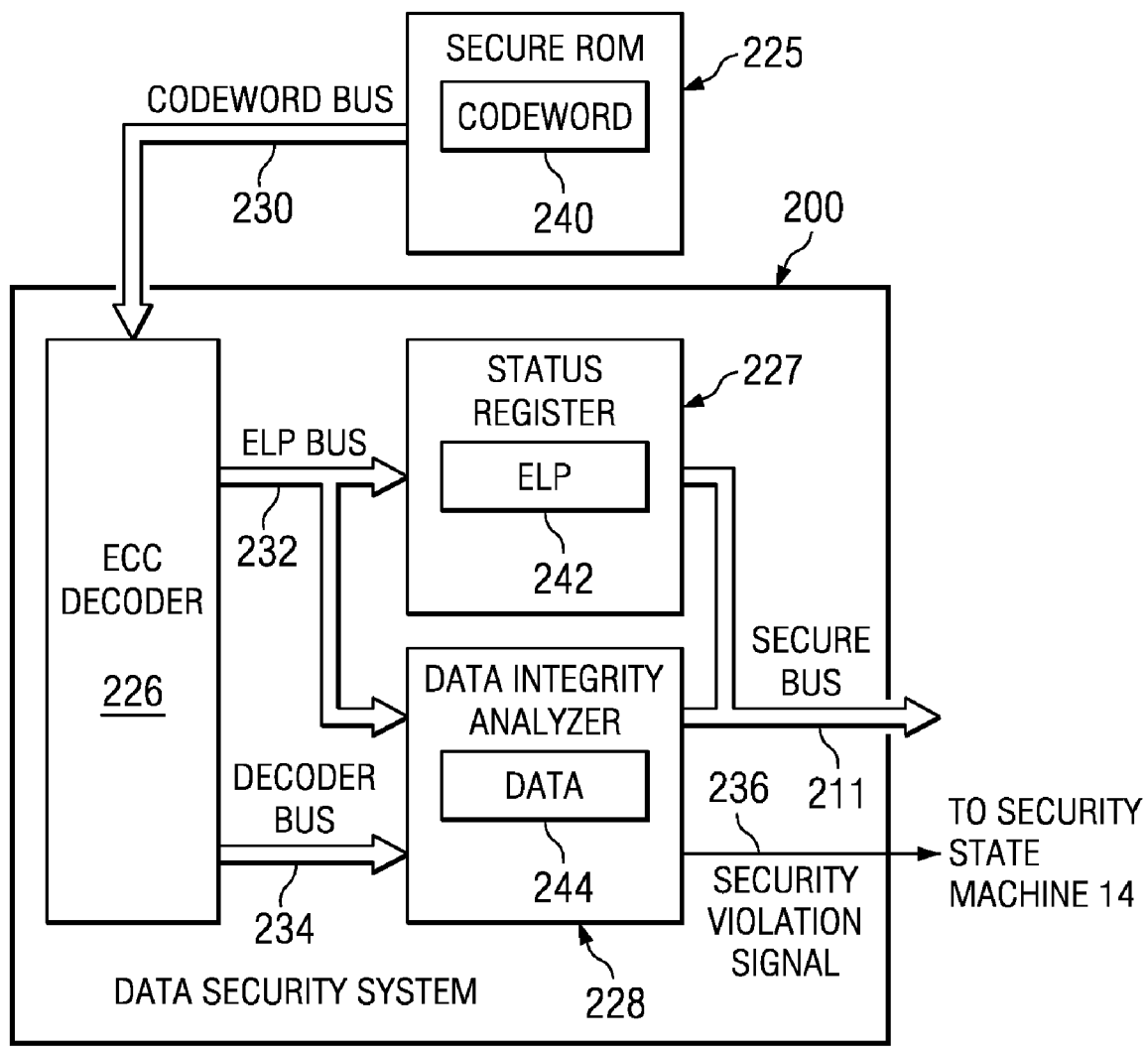
FIG. 2 illustrates a data security system constructed in accordance with at least some embodiments of the invention.

A detailed illustration of the data security system 200, in accordance with at least some embodiments, is shown in FIG. 2. Secure ROM 225 couples to ECC decoder 226 via codeword bus 230. The ECC decoder 226 reads a codeword 240 from the secure ROM 225 in response to a data read request from another component of the computing system 100 (e.g., MPU 10). The codeword 240 may comprise data and an error correction code (ECC) associated with the data. A Bose-Chaudhuri-Hocquenghem (BCH) or other similar error correction code may be preferred since it results in a value for the codeword 240 comprising a distribution of bit settings comparable to a pseudo random number generator. Because of this property, a change in value of a single data bit would require a corresponding change, on average, of half the number of ECC bits.

The ECC decoder 226 couples to the data integrity analyzer 228 via the decoder bus 234, and to both the data integrity analyzer 228 and the status register 227 via the error location polynomial bus (ELP bus) 232. The data integrity analyzer also may couple to the security state machine 14 via security violation signal 236 (FIG. 1). The error location polynomial (ELP) 242 may be derived from codeword 240 by ECC decoder 226 and stored in the status register 227 where it can be accessed by the data integrity analyzer 228 via the ELP bus 232. The status register may also couple to other components within the computing system 100 (e.g., DSP 16) via secure bus 211, and the error location polynomial 242 may thus be accessed by these components. Likewise, ECC decoder 226 may decode data from the codeword 240 and store the resulting data 244 in a data integrity analyzer 228. Data integrity analyzer 228 may also couple to other components within the computing system 100 via secure bus 211 so as to provide access to the data 244.

In accordance with at least some embodiments, the ECC decoder 226 may use a Berlekamp-Massey algorithm to derive the error location polynomial 242 from the codeword 240. The resulting error location polynomial 242 characterizes errors that exist in the codeword 240. The degree of the error location polynomial 242 is indicative of the number of errors, and the error location polynomial 242 may be used to generate the information necessary to locate the specific bits in error within the codeword 240. The number of data bits and the number of ECC bits control the maximum number of bits that may be thus corrected. For example, a codeword 240 comprising 320 data bits and 63 BCH encoded ECC bits will result in the ability to correct up to a maximum of 7 bits in error within the codeword 240.

The data integrity analyzer 228 uses the error location polynomial 242 stored in status register 227 to determine if an error has been detected. If an error is detected, the degree of the error location polynomial 242 will be non-zero and will reflect the number of errors detected. Thus, if the codeword 240 contains 3 bits in error, the error location polynomial 242 generated from the codeword 240 by the ECC decoder 226 will be a third order polynomial. If an error is detected, the data integrity analyzer 228 may signal the security state machine 14 via security violation signal 236. The security state machine 14 may take appropriate action in response to the asserted security violation signal 236. Such action that may include, for example, denying access to the requested data, disabling selected features of the computing system 100, and completely disabling the computing system 100.

If a detected error is correctable, the actual bit location of the error within the codeword 240 may be determined, for example, by performing a Chien search on the error location polynomial 242. The choice for the maximum number of correctable errors may be affected by a number of factors. In accordance with at least some embodiments, the number may be chosen so as to allow for a number of failures of individual bits within the secure ROM 225. Such failures, if below the maximum number of correctable bits chosen, would be corrected "on-the-fly" during operation and would not require any special intervention during production testing of the part by the manufacturer. Allowing for production failures within the secure ROM 225 reduces overall production costs by increasing the number of usable ROMs without imposing additional testing or repair requirements. In addition, later reliability failures of the secure ROM 225 would also be automatically corrected during normal operation, reducing the number of ROMs that may cause the computing system 100 to fail after being put into operation. Thus, for example, if the data security system 200 is designed with a chosen maximum number of correctable errors equal to 7, the computing system 100 would continue to operate even if there were five factory bit failures and two later operational bit failures within the secure ROM 225. The data security system 200 would correct the errors as the codeword 240 was read and present the correct data 244 on the secure bus 211 for use by other components of the computing system 100.

The choice of a small number of correctable errors, such as 7, allows these errors to be distinguished from attempts at altering the contents of the secure ROM 225. The choice of error correction code (such as the BCH code) results in the need to change a large number of error correction bits if a data bit is altered in order for the ECC decoder 226 to not detect an error. This may significantly increase the difficulty of altering the contents of the secure ROM 225. This increase in difficulty may be due to the difficulty in reprogramming large numbers of bits within the secure ROM 225 without damaging the ROM.

The difficulty in reprogramming secure ROM 225 may also be due to the "one-way" nature of programming bits in use in many programmable ROMs. In accordance with at least some embodiments, the secure ROM 225 may comprise an E-fuse based ROM, wherein a binary "1" may be programmed by "burning" a fuse. Burning of the fuse may comprise passing an electrical current through the fuse such that the material used to form the fuse is disrupted, producing a physical interruption that substantially prevents an electrical signal from passing through the fuse. In such an embodiment, a binary "0" may be programmed by not burning the fuse, and reprogramming the contents of secure ROM 225 may be limited to burning fuses of bits not already programmed as binary a binary "1". Thus a malicious user that wishes to alter the contents of the secure ROM 225 would have to chose a value that, when compared to the value already programmed, would require only that additional binary "1's" be added to the existing value. The choice of a BCH error correction code can significantly limit the number of values available and thus make this task extremely difficult.

Figure 3:
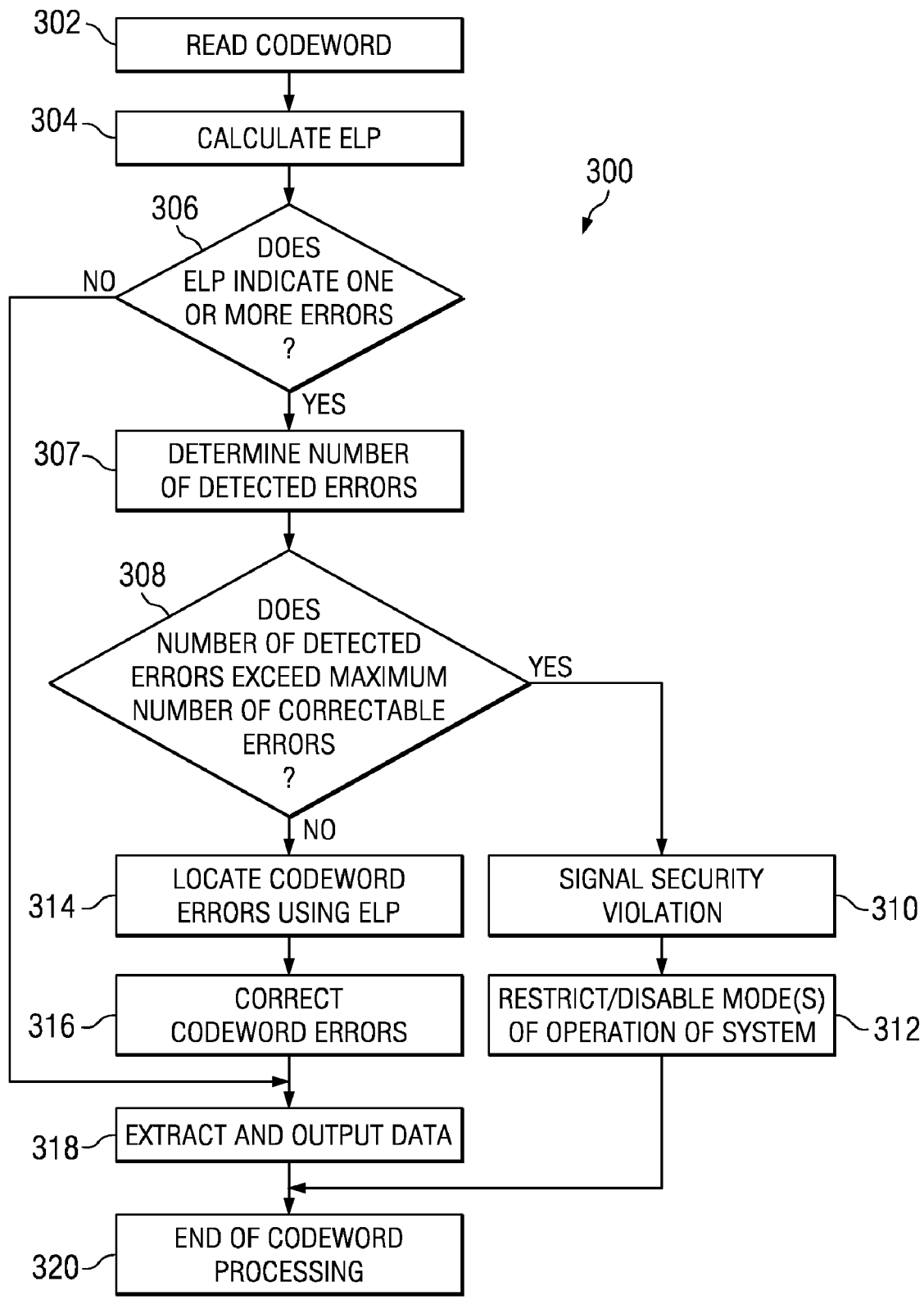
FIG. 3 illustrates a method for detecting and counteracting an attack in accordance with at least some embodiments of the invention.

A method 300 for using an error correction code to detect security violations, in accordance with at least some embodiments, is illustrated in FIG. 3. Referring to both FIGS. 2 and 3, the codeword 240 comprising an error correction code and data is first read as shown in block 302. A BCH error correction code may be preferred for reasons previously described. The error location polynomial 242 is then calculated as shown in block 304 in order to be able to determine if one or more errors have occurred within the codeword 240 read from secure ROM 225 as shown in block 306. If there are no errors detected, the data 244 is extracted from the codeword 240 and output to secure bus 211 as shown in block 318, ending the processing of the codeword 240 in block 320.

If the error location polynomial 242 indicates the presence of one or more errors in the codeword 240, the number of detected errors is determined in block 307 and is then compared with the maximum number of correctable errors, as shown in block 308. If the number of detected errors is greater than the maximum number of correctable errors, a security violation is signaled in block 310. As shown in block 312 and in accordance with at least some embodiments, one or more modes of operation of a system implementing the method 300 may be restricted or disabled, or the entire system may be disabled altogether in response to the assertion of the security violation signal 236. Such modes of operation may include, for example, a communication mode, an address book mode, and a camera mode. A restriction of a mode of operation of the system may include, for example, disabling a radio frequency transceiver section of a cellular telephone, thus preventing the use of the system for telephonic communication (i.e., disabling the communication mode). Other modes such as, for example, the address book mode and the camera mode may continue to be accessible by the user. Once a mode of operation of the system is restricted or disabled, processing of the codeword 240 ends in block 320.

If the number of detected errors is not found to be greater than the maximum number of correctable errors (block 308), the error location polynomial 242 is then used to locate one or more bits in error within the codeword 240 as shown in block 314. The located bits are then corrected in block 316. Once the codeword 240 is corrected, the data 244 is extracted from the codeword 240 and output to the secure bus 211 as shown in block 318. Once the data 244 has been output to the secure bus 211, processing of the codeword 240 ends in block 320. It should be noted that although the embodiments described signal a security violation when the number of detected errors exceeds the maximum number of correctable errors, other embodiments may signal a security violation if the number of detected errors exceeds a different threshold value that is less than the maximum number of correctable errors.

The above disclosure is meant to be illustrative of the principles and various embodiments of the present invention. Numerous variations and modifications will become apparent to those skilled in the art once the above disclosure is fully appreciated. It is intended that the following claims be interpreted to embrace all such variations and modifications.

What is claimed is:

1. A method for detecting a security violation, comprising:
reading a codeword comprising data and an error correction code (ECC), the ECC associated with the data;
deriving an error location polynomial (ELP) from the codeword;
determining a total number of codeword errors from the ELP;
detecting if there is a malicious attempt to alter the data by determining if the total number of codeword errors exceeds a maximum error threshold; and
preventing access to the data within the codeword if a malicious attempt to alter the data is detected.

2. The method of claim 1, wherein the maximum error threshold equals a maximum number of correctable errors.

3. The method of claim 1, further comprising locating and correcting a codeword error if the total number of codeword errors does not exceed the maximum error threshold, the codeword error located and corrected using the ELP.

4. The method of claim 1, wherein the maximum error threshold equals a maximum number of correctable errors.

5. The method of claim 1, wherein the EGG comprises a Bose-Chaudhuri-Hocquenghem encoded ECC; and wherein deriving the ELP comprises using a Berlekamp-Massey algorithm.

6. A system for detecting a security violation, comprising:
a security controller;
a secure non-volatile memory that stores a codeword comprising data and an error correction code (ECC), the ECC associated with the data;
an ECC decoder that reads the codeword from the non-volatile memory and calculates an error location polynomial (ELP) from the codeword, the ECC decoder coupled to the secure non-volatile memory; and
an integrity analyzer that derives a number of codeword errors from the ELP, the integrity analyzer coupled to the ECC decoder and the security controller; wherein a maximum error threshold is defined for the system as indicating a malicious attempt to alter the data; and wherein the integrity analyzer signals a security violation to the security controller if the number of codeword errors exceeds the maximum error threshold.

7. The system of claim 6, wherein the maximum error threshold equals a maximum number of correctable errors.

8. The system of claim 6, wherein the security controller resets the system when the integrity controller signals the security violation.

9. The system of claim 6, wherein a request for the data by a component within the system triggers the codeword read and the ELP calculation by the ECC decoder, and triggers the derivation of the number of codeword errors by the integrity analyzer;
and wherein the security controller causes the request for the data to be denied when the integrity controller signals the security violation.

10. The system of claim 9, wherein the component within the system that requests the data comprises a processor.

11. The system of claim 6, wherein the non-volatile memory comprises an electrical fuse used to program the data into the non-volatile memory.

12. The system of claim 6, wherein the integrity analyzer further uses the ELP to locate and correct a codeword error if the number of codeword errors does not exceed the maximum error threshold.

13. The system of claim 12, wherein the maximum error threshold equals a maximum number of correctable errors.

14. A mobile communication device, comprising:
a radio frequency (RF) transceiver having one or more modes of operation;
a secure non-volatile memory that stores a codeword comprising data and an error correction code (ECC), the ECC associated with the data;
a maximum error threshold stored in the non-volatile memory; and
a data security system that reads the codeword from the non-volatile memory, the data security system coupled to the secure non-volatile memory and to the RF transceiver;
wherein the data security system determines a number of codeword errors and distinguishes data errors from malicious attempts to alter the data in the secure non-volatile memory; and wherein the data security system disables a mode of operation of the one or more modes of operation of the RF transceiver if the number of codeword errors exceeds the maximum error threshold.

15. The mobile communication device of claim 14, wherein the maximum error threshold equals a maximum number of correctable errors.

16. The mobile communication device of claim 14, wherein the data security system further derives an error location polynomial (ELP) from the codeword, the ELP used to locate a bit location of a codeword error; and wherein the data security system further corrects the codeword error if the number of codeword errors does not exceed the maximum error threshold.

17. The mobile communication device of claim 16, wherein the maximum error threshold equals a maximum number of correctable errors.

18. The mobile communication device of claim 14, wherein the secure non-volatile memory comprises an electrical fuse used to program the data into the secure non-volatile memory.

19. A method used in a mobile communication device, comprising:
   reading a codeword comprising data and an error correction code (ECC), the ECC associated with the data;
   deriving an error location polynomial (ELP) from the codeword;
   determining a total number of codeword errors from the ELP;
   detecting if there is a malicious attempt to alter the data by determining if the total number of codeword errors exceeds a maximum error threshold; and
   preventing use of a feature of the mobile communication device if a malicious attempt to alter the data is detected.

20. The method of claim 19, wherein the maximum error threshold equals a maximum number of correctable errors.

21. The method of claim 19, wherein preventing the use of a feature comprises preventing access to the data.

22. The method of claim 19 wherein preventing the use of a feature comprises preventing the mobile communication device from transmitting and receiving radio frequency signals.

23. The method of claim 19, further comprising locating and correcting a codeword error if the total number of codeword errors does not exceed the maximum error threshold, the codeword error located and corrected using the ELP.

24. The method of claim 23, wherein the maximum error threshold equals a maximum number of correctable errors.

25. The method of claim 19, wherein the ECC comprises a Bose-Chaudhuri-Hocquenghem encoded ECC; and wherein deriving the ELP comprises using a Berlekamp-Massey algorithm.

* * * * *